United States Patent
Dalmia (10) Patent No.: US 6,310,521 B1
(45) Date of Patent: Oct. 30, 2001

(54) REFERENCE-FREE CLOCK GENERATION AND DATA RECOVERY PLL

(75) Inventor: Kamal Dalmia, Austin, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/471,576

(22) Filed: Dec. 23, 1999

(51) Int. Cl.[7] .................................................. H03L 7/087
(52) U.S. Cl. ............................ 331/11; 331/1 A; 331/14; 331/17; 331/25; 331/DIG. 2; 327/156; 327/157; 327/159
(58) Field of Search .......................... 331/1 A, 10, 11, 331/14, 17, 18, 25, DIG. 2; 327/156–159; 455/260; 375/376

(56) References Cited

U.S. PATENT DOCUMENTS

| | | | |
|---|---|---|---|
| 4,593,254 | * 6/1986 | Coburn | 331/1 A |
| 4,594,564 | 6/1986 | Yarborough, Jr. | 331/1 A |
| 4,940,952 | 7/1990 | Kegasa | 331/11 |
| 4,943,788 | * 7/1990 | Laws et al. | 331/11 |
| 5,506,875 | * 4/1996 | Nuckolls et al. | 375/375 |
| 5,574,756 | 11/1996 | Jeong | 331/11 |
| 5,694,088 | * 12/1997 | Dickson | 331/12 |
| 5,712,580 | 1/1998 | Baumgartner et al. | 375/376 |
| 5,739,709 | 4/1998 | Banno | 327/156 |
| 5,799,048 | 8/1998 | Farjad-Rad et al. | 375/360 |
| 5,950,115 | 9/1999 | Momtaz et al. | 455/73 |
| 5,953,386 | 9/1999 | Anderson | 375/376 |
| 6,041,090 | 3/2000 | Chen | 375/376 |
| 6,055,286 | 4/2000 | Wu et al. | 375/375 |
| 6,075,416 | * 6/2000 | Dalmia | 331/25 |
| 6,081,572 | * 6/2000 | Filip | 375/376 |

OTHER PUBLICATIONS

A 1Gb/s CMOS Clock and Data Recovery Circuit, by Hui Wang and Richard Nottenburg, 1999 IEEE International Solid–State Circuits Conference, Feb. 17, 1999, pp. 354–355.

Kamal Dalmia et al., Data Frequency Detector, Serial No. 09/471,915, Filed Dec. 23, 1999.

Kamal Dalmia, Reference–Free Clock Generator and Data Recovery, Serial No. 09/471,914, Filed Dec. 23, 1999.

Kamal Dalmia, Digital Phase/Frequency Detector, and Clock Generator and Data Recovery PLL Containing the Same, Serial No. 09/470,665, Filed Dec. 23, 1999.

* cited by examiner

Primary Examiner—David Mis
(74) Attorney, Agent, or Firm—Christopher P. Maiorana, P.C.

(57) ABSTRACT

An apparatus comprising a first circuit, a second circuit, and a logic circuit. The first circuit may be configured to generate one or more first control signals having a first data rate in response to an input signal having a second data rate and a clock signal having the first data rate. The second circuit may be configured to generate one or more second control signals in response to the input signal and the clock signal. The first logic circuit may be configured to generate the clock signal in response to the one or more first control signals, the one or more second control signals and a third control signal.

19 Claims, 6 Drawing Sheets

REFERENCE-FREE CLOCK GENERATION AND DATA RECOVERY PLL

CROSS REFERENCE TO RELATED APPLICATIONS

The present application may relate to co-pending application Ser. No. 09/471,915, filed Dec. 23, 1999, Ser. No. 09/471,914, filed Dec. 23, 1999 and Ser. No. 09/470,665, filed Dec. 23, 1999 and each hereby incorporated by reference in their entirety.

FIELD OF THE INVENTION

The present invention relates to the recovery of clock signal(s) from a serial input data stream generally and, more particularly, to a method and/or architecture for a linear clock and data recovery phase-lock loop (PLL).

BACKGROUND OF THE INVENTION

Figure 1:
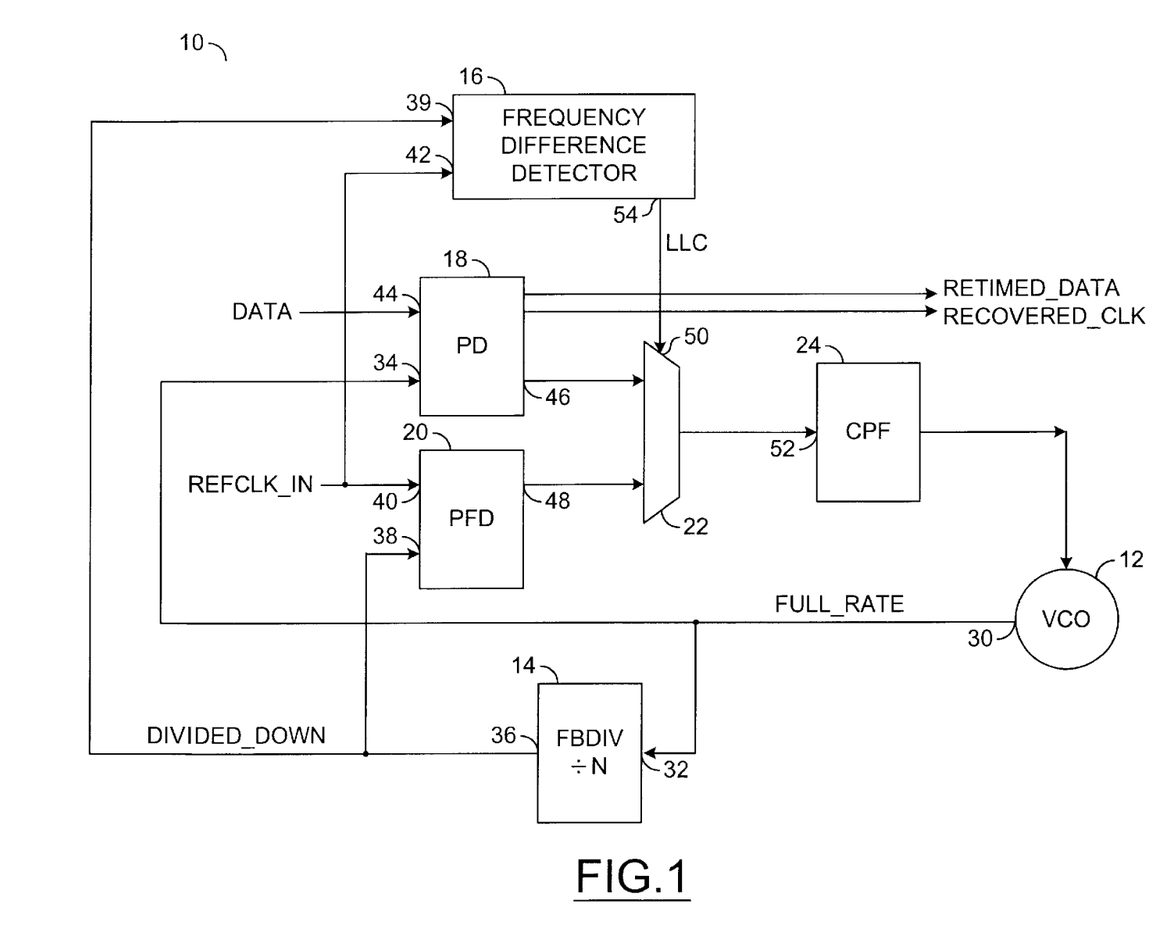
FIG. 1 is a block diagram of a conventional circuit for clock and data recovery.

Referring to FIG. 1 a conventional clock and data recovery circuit 10 implemented in a serial data communication device is shown. The circuit 10 comprises an VCO 12, a divider 14, a frequency difference detector (FDD) 16, a phase detector (PD) 18, a phase-frequency detector (PFD) 20, a multiplexer 22 and a charge pump filter (CPF) 24. The VCO 12 generates a full-rate clock signal (i.e., FULL_RATE) at an output 30. The clock signal FULL_RATE is presented to an input 32 of the divider 14 and to an input 34 of the phase detector 18. The clock signal FULL_RATE is divided (i.e., by an integer N), by the divider 14. The divider 14 presents a divided clock signal (i.e., DIVIDED) at an output 36. The clock signal DIVIDED is presented to an input 38 of the phase-frequency detector 20 and to an input 39 of the frequency difference detector 16.

The phase-frequency detector 20 also has an input 40 that receives a reference clock signal (i.e., REFCLK_IN). The phase-frequency detector 20 compares the clock signal REFCLK_IN and the clock signal DIVIDED_DOWN. The clock signal REFCLK_IN is presented to an input 42 of the frequency difference detector 16. The phase detector 18 has an input 44 that receives a signal DATA. The signal DATA operates at a full rate. An output 46 of the phase detector 18 is connected to a first input of the multiplexer 22. An output 48 of the phase-frequency detector 20 is connected to a second input of the multiplexer 22. The signals presented at the outputs 46 and 48 are pump-up and pump-down signals.

The multiplexer 22 has an input 50 that receives a control signal LLC. The multiplexer 22 presents a multiplexed signal to an input 52 of the charge pump filter 24. The multiplexer 22 presents the multiplexed signal in response to the signal LLC. The frequency difference detector 16 presents the signal LLC at an output 54 in response to a comparison between the clock signal REFCLK_IN and the clock signal DIVIDED. If the frequency of the signal REFCLK and the signal DIVIDED are within a certain range, the frequency difference detector 16 toggles the signal LLC. The signal LLC controls (i) the "locking" of the PLL to the clock REFCLK_IN or (ii) the signal DATA. When the PLL is frequency locked to the clock signal REFCLK_IN, the multiplexer 22 is switched to select the rate of the signal DATA. The closed loop with the phase detector 18 then locks to the rate of the signal DATA and generates a signal RETIMED_DATA and a clock signal RECOVERD_CLK. The circuit 10 requires the implementation of the reference clock signal REFLCK_IN of the frequency difference detector 16.

Figure 2:
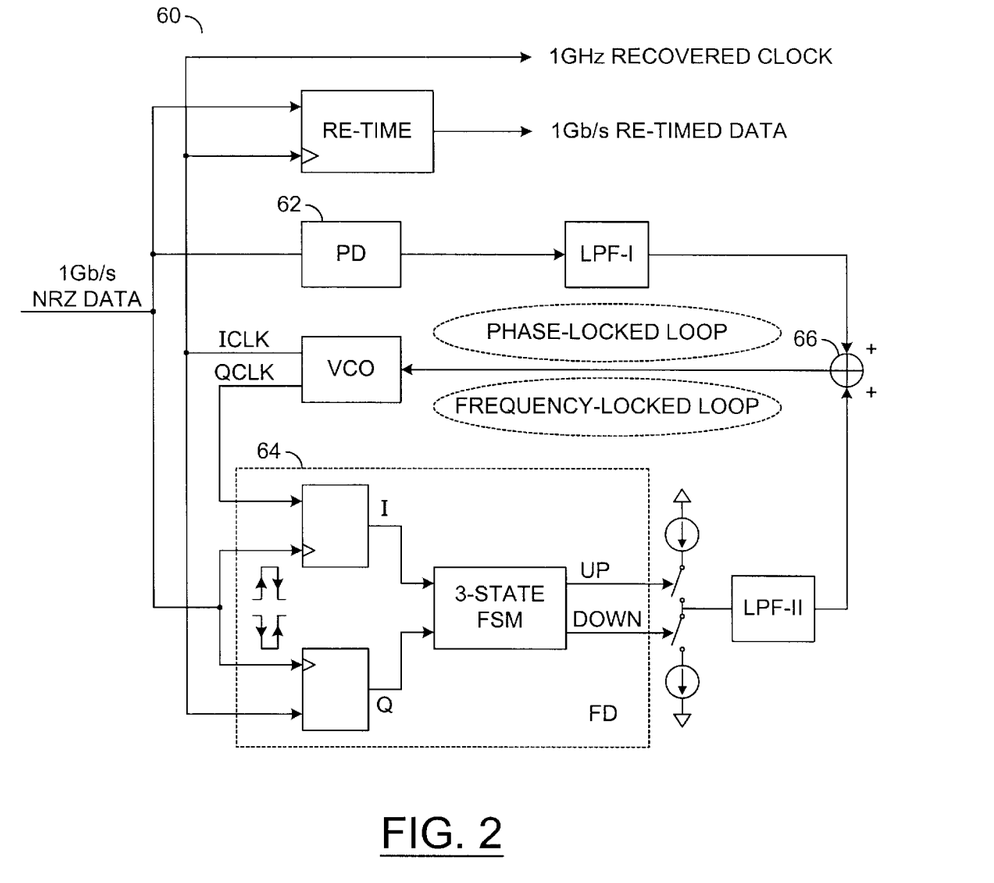
FIG. 2 is a block diagram of a conventional circuit for clock and data recovery.
Figure 3:
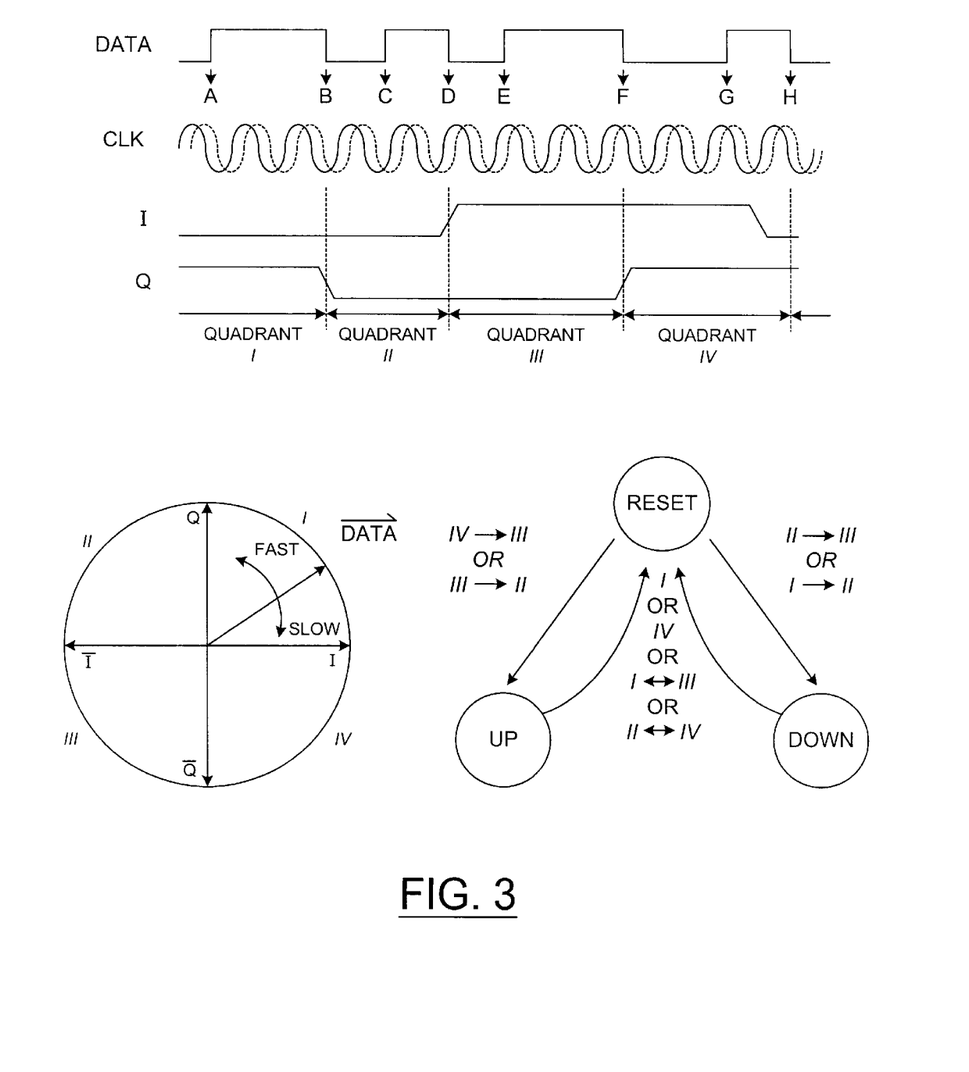
FIG. 3 is a timing diagram of the circuit of FIG. 2.

Referring to FIG. 2, a conventional circuit 60 for performing clock and data recovery in a serial data communication device is shown. FIG. 3 illustrates a timing diagram of the circuit of FIG. 2. The circuit 60 implements an analog phase detector 62 and a digital frequency detector 64. The circuit 60 implements a full-rate clock CLK and corresponding quadrature Q for frequency detection (shown in FIG. 1). The circuit 60 implements dual loop filter design. The output of the phase detector 62 and the output of the frequency detector 64 are added together by the loop filter 66 (i.e., analog summing). The analog phase detector 62 is not robust in the presence of (i) data dependent jitter and/or (ii) missing data transitions. Hence, the circuit 60 provides a low overall jitter tolerance.

SUMMARY OF THE INVENTION

The present invention concerns an apparatus comprising a first circuit, a second circuit and a logic circuit. The first circuit may be configured to generate one or more first control signals having a first data rate in response to an input signal having a second data rate and a clock signal having a first data rate. The second circuit may be configured to generate one or more second control signals in response to the input signal and the clock signal. The first logic circuit may be configured to generate the clock signal in response to the one or more first control signals, the one or more second control signals and a third control signal.

The objects, features and advantages of the present invention include providing a circuit that may (i) enable reference-less clock and data recovery, (ii) not require a reference clock generator, (iii) reduce overall circuit die size, (iv) reduce system cost and/or (v) not involve an addition based dual loop architecture.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 4:
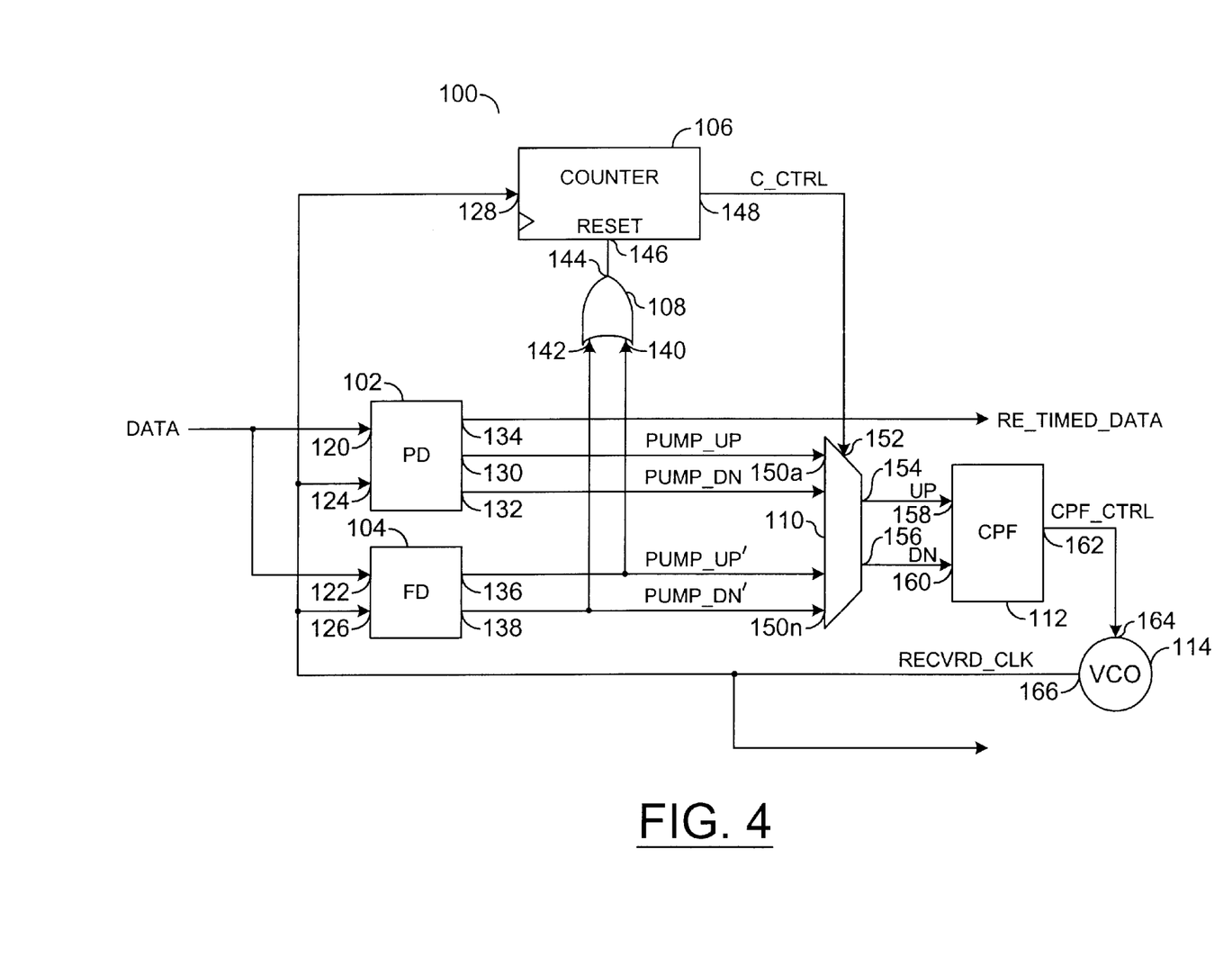
FIG. 4 is a block diagram of a preferred embodiment of the present invention.

Referring to FIG. 4, a block diagram of a circuit 100 is shown in accordance with a preferred embodiment of the present invention. The circuit 100 may be implemented as a linear clock and data recovery phase-lock loop (PLL). The circuit 100 may recover clock signal(s) from a serial input data stream. The circuit 100 may re-time an input data stream with the recovered clock signal to generate a re-timed data signal. The circuit 100 may be implemented without the use of a reference clock signal. The circuit 100 may be implemented as a reference-less active loop circuit.

The circuit 100 may comprise a phase detector (PD) 102, a frequency detector (FD) 104, a counter block (or circuit) 106, a gate 108, a multiplexer 110, a charge pump block (or circuit) 112 and an VCO block (or circuit) 114. The phase detector 102 and the frequency detector 104 may be implemented as a digital phase detector and a digital frequency detector, respectively. Examples of the phase detector 102 and the frequency detector 104 may be found in co-pending application Ser. No. 09/471,915, filed Dec. 23, 1999. The frequency detector 104 may generate pulses of generally constant width during a frequency acquisition. In general, the frequency detector 104 may be implemented as a full-rate frequency detector. Additionally, the frequency detector 104 may not generate any pulses when the PLL is in a "lock" condition with respect to a data frequency.

The phase detector 102 and the frequency detector 104 may each receive a signal (e.g., DATA) at an input 120 and 122, respectively. The signal DATA may be implemented as an input data signal having a first data rate, or any other type signal in order to meet the criteria of a particular implementation. Furthermore, the phase detector 102 and the frequency detector 104 may each receive two phases of a clock signal (e.g., RECVD_CLK) at an input 124 and 126, respectively. The signal RECVD_CLK may also be presented to an input 128 of the counter 106.

The phase detector 102 may have an output 130 that may present a signal (e.g., PUMP_UP) and an output 132 that may present a signal (e.g., PUMP_DN). The signals PUMP_UP and PUMP_DN may be implemented as charge pump signals. The phase detector 102 may also have an output 134 that may generate a signal (e.g., RE_TMD_DATA). The signal RE_TMD_DATA may be implemented as a retimed data clock signal operating at a second data rate or any other type of signal in order to meet the criteria of a particular implementation. The phase detector 102 may generate the signal PUMP_UP, the signal PUMP_DN and/or the signal RE_TMD_DATA in response to the signal DATA and the signal RECVD_CLK.

The frequency detector 104 may have an output 136 that may present a signal (e.g., PUMP_UP') and an output 138 that may present a signal (e.g., PUMP_DN'). The signals PUMP_UP' and PUMP_DN' may be implemented as charge pump signals. The frequency detector 104 may generate the signals PUMP_UP' and/or PUMP_DN' in response to the signal DATA and the signal RECVD_CLK. The signal PUMP_UP' may be presented to an input 140 of the gate 108. The signal PUMP_DN' may be presented to an input 142 of the gate 108. In one example, the gate 108 may be implemented as an "OR" gate. However, the gate 108 may be implemented as any other type logic gate necessary in order to meet the criteria of a particular implementation.

The gate 108 may compare the signals PUMP_UP' and PUMP_DN'. The gate 108 may have an output 144 that may be connected to an input 146 of the counter 106. The gate 108 may control the counter 106. The counter 106 may also have an input 128 that may receive the signal RECVRD_CLK. The counter 106 may count the number of altered clock signals in the signal RECVD_CLK generated by the VCO 114. The counter 106 may also be reset in response to the gate 108. The counter 106 may generate a control signal (e.g., C_CTRL) at an output 148.

The signal PUMP_UP, the signal PUMP_DN, the signal PUMP_UP' and the signal PUMP_DN' may each be presented to a number of inputs 150a–150n of the multiplexer 110. The multiplexer 110 may also have an input 152 that may receive the signal C_CTRL. The multiplexer 110 may have an output 154 that may present a first multiplexed signal (e.g., UP) and an output 156 that may present a second multiplexed signal (e.g., DN). The signals UP and DN may be implemented as charge pump signals. The multiplexing of the signal PUMP_UP, the signal PUMP_DN, the signal PUMP_UP' and the signal PUMP_DN' is generally controlled by the signal C_CTRL. The signals UP and DN may be generated in response to the control signal C_CTRL, the signal PUMP_UP, the signal PUMP_DN, the signal PUMP_UP' and the signal PUMP_DN'.

The signals UP and DN may be presented to an input 158 and 160, respectively, of the charge pump block 112. The charge pump block 112 may be implemented as a charge pump and filter. The charge pump and filter 112 may have an output 162 that may present a signal (CPF_CTRL) in response to the signal UP and the signal DN. =The signal CPF_CTRL may be presented to an input 164 of the VCO 114. The signal CPF_CTRL may control the VCO 112. The VCO 112 may have an output 166 that may present the signal RECVRD_CLK in response to the signal CPF_CTRL.

During lock acquisition, the frequency detector 104 is generally active and may frequently generate the charge pump signals PUMP_UP' and PUMP_DN'. The signals PUMP_UP' and PUMP_DN' may cause the counter 106 to reset frequently, which may prevent the counter 106 from reaching a pre-determined count value N, where N is an integer.

When the loop is locked, the frequency detector 104 may stop generating the signals PUMP_UP' and PUMP_DN'. The counter 106 may eventually count to the value N and stop. The counter 106 may be implemented to stop counting when reaching N (e.g., the counter does not roll over). The counter 106 may decode the value N to generate the signal C_CTRL. The signal C_CTRL may be implemented, in one example, as a "lock to data" signal. The multiplexer 110 may multiplex the signal PUMP_UP and the signal PUMP_DN in place of the signal PUMP-UP' and the signal PUMP_DN', in response to the signal C_CTRL. The multiplexer 110 generally selects one of the two charge pump signal pairs (i) PUMP_UP and PUMP_DN or (ii) PUMP UP' and PUMP_DN' to be presented at the outputs 154 and 156.

If the PLL frequency drifts due to jitter or loss of the data rate DATA, the frequency detector 104 may generate either the pump signal PUMP_UP' or the pump signal PUMP_DN'. The pump signals PUMP_UP' and/or PUMP_DN' may cause the counter 106 to reset. The counter 106 may change the count from the value N to a start value and may toggle the control signal C_CTRL. The toggled control signal C_CTRL may switch the frequency detector 104 back into the loop.

Figure 5:
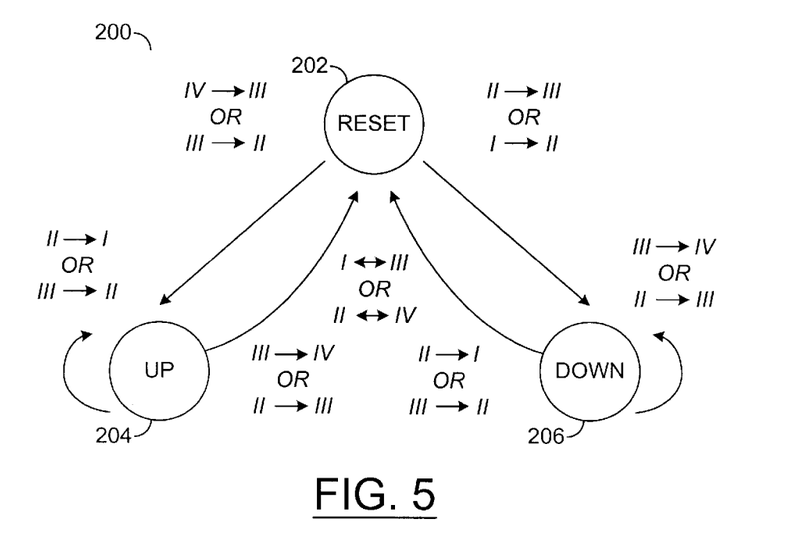
FIG. 5 is a state diagram illustrating the operation of the frequency detector of FIG. 4.

Referring to FIG. 5, a state diagram (or state machine) 200 is shown in accordance with a preferred embodiment of the present invention. The state diagram 200 generally comprises a "reset" state 202, an "up" state 204 and a "down" state 206. The state machine 200 may respond to a previous state as well as a current transition. For example, a transition between the quadrant III to the quadrant II may (i) cause a transition to the up state 204 if the state machine is in the reset state 202, (ii) remain in the up state 204 if the state machine 200 is in the up state 204 or (iii) cause a transition to the reset state 202 if the state machine 200 is in the down state 206. Other transitions have similar multiple responses.

As illustrated, the next state of the state machine 200 generally depends upon the previous state for each transition between two consecutive quadrants. The state machine 200 may generate every valid up and down transition signal. The state machine 200 may be used to improve lock time when implemented in a frequency detector. A transition of the signal DATA may (i) sample the signal CLK and QCLK (ii) respond with the appropriate action (e.g., either a transition to a new state or remain in the current state).

The state machine 200 may provide an improvement in jitter tolerance by allowing transitions between quadrants II and III. The state machine 200 may be used in clock and data recovery PLL designs that may operate at Gigabit/sec (and higher) data rates. The state machine 200 may enable (i) the implementation of a clock recovery PLL with no reference clock, (ii) improved lock range and (iii) improved lock time.

Figure 6:
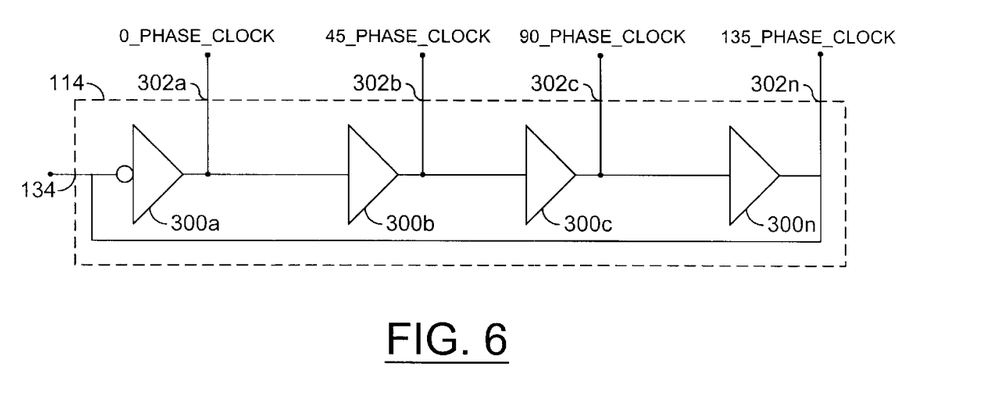
FIG. 6 is a detailed block diagram of the VCO of FIG. 4.

Referring to FIG. 6 a block diagram of the VCO 110 is shown. The VCO 110 may comprise a number of inverters (or buffers) 300a–300n. The inverter 300a may have an output 302a that may present a signal (e.g., 0_PHASE_CLOCK). The signal 0_PHASE_CLOCK may also be presented to the inverter 300b. The inverter 300b may have an output 302b that may present a signal (e.g., 45_PHASE_CLOCK) in response to the signal 0_PHASE_CLOCK. The signal 45_PHASE CLOCK may also be presented to the inverter 300c. The inverter 300c may have an output 302c that may present a signal (e.g., 90_PHASE_CLOCK) in response to the signal 45_PHAGE_CLOCK. The signal 90_PHASE_CLOCK may also be presented to the inverter 300n. The inverter 300n may have an output 302n that may present a signal (e.g., 135_PHASE_CLOCK) in response to the signal 90_PHASE_CLOCK. The signal 135_PHASE_CLOCK may also be presented to the inverter 300a. The inverter 300a may generate the signal 0_PHASE-CLOCK in response to the signal 135_PHASE_CLOCK.

Each of the signals 0_PHASE_CLOCK, 45_PHASE_CLOCK, 90_PHASE-CLOCK and 135_PHASE_CLOCK may be presented as the signal RECVD_CLK at the output 111 of the VCO 110. The VCO 110 may be implemented, in one example, to generate half-rate quadrature clocks. In one example, the VCO 110 may be implemented as a classic ring oscillator VCO. However, the VCO 110 may be implemented as any type VCO in order to meet the criteria of a particular implementation.

The circuit 100 may enable reference-less clock and data recovery. The circuit 100 may provide clock and data recovery without a reference clock generator, such as a crystal oscillator. The absence of the reference clock generator may reduce overall system cost. The circuit 100 may also be implemented without a clock difference detector. The absence of the clock difference detector may further reduce die area and/or system cost.

Figure 7:
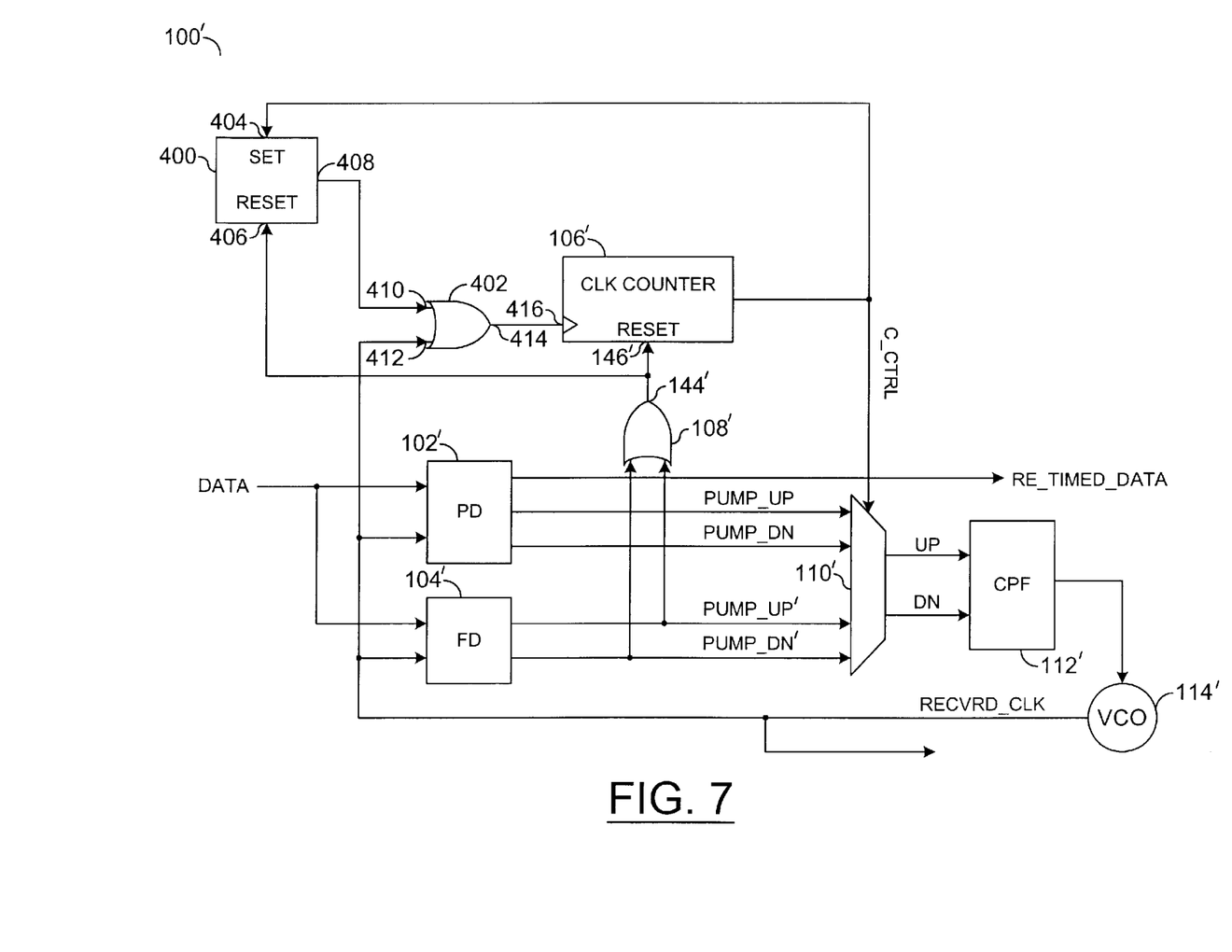
FIG. 7 is a block diagram of an alternate embodiment of the present invention.

Referring to FIG. 7 a block diagram of a circuit 100' is shown in accordance with an alternate embodiment of the present invention. The circuit 100' may operate and/or have similar components to the circuit 100 (generally shown with a primed notation). The circuit 100' may implement a modified control of the counter 106'. The circuit 100' may additionally implement a logic block (or circuit) 400 and a gate 402. The logic block 400 may be implemented as a set-reset flip-flop. The gate 402 may implemented as an "OR" type logic gate. However, the logic block 400 and the gate 402 may be implemented as any type logic block and/or logic gate needed to meet the criteria of a particular implementation.

The signal C_CTRL may be presented to an input 404 of the flip-flip 400. The flip-flop 400 may also have an input 406 that may receive a signal from the output 144 of the gate 108'. The flip-flop 400 may also have an output 408 that may present a signal to an input 410 of the gate 402 in response to the signal C_CTRL and the gate 108'. The gate 402 may also have an input 412 that may receive the signal RECVRD_CLK. The gate 402 may have an output 414 that may present a signal to an input 416 of the counter 106'. The gate 402 may control the counter 106'.

When a "lock to data" is asserted, the signal from the output 408 is generally set to a first state (e.g., active high or a "1"). The circuit 100' may prevent the counter 106' from reaching the value N. In an example where the counter 106' is implemented using CMOS technology, the counter 106' may be dormant when PLL locks to the signal DATA. If the PLL drifts out of lock due to jitter, the pump signals PUMP_UP' and PUMP_DN' may reset the flip-flop 400. The reset flip-flop 400 may present the clock signal RECVRD_CLK to the counter 106'. Since the PLL may operate in the "lock to data" mode during normal operation, the counter 106' may not normally toggle. Such a non-toggled counter 106' may implement a reduced power consumption.

The circuit 100 may enable reference-less clock and data recovery. The circuit 100 may be implemented without a reference clock generator, such as a crystal oscillator. The circuit 100 may have a reduced die area and a reduced system cost. The circuit 100 may not require an addition based dual loop architecture.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a first circuit configured to generate one or more first control signals having a first data rate in response to (i) an input signal having a second data rate and (ii) a clock signal having said first data rate;
   a second circuit configured to generate one or more second control signals having said first data rate in response to (i) said input signal and (ii) said clock signal; and
   a first logic circuit configured to generate said clock signal in response to (i) said one or more first control signals, (ii) said one or more second control signals and (iii) a third control signal, wherein one of said first control signals and said second control signals comprises a pump-up signal and another one of said first control signals and said second control signals comprises a pump-down signal.

2. The apparatus according to claim 1 further comprising:
   a second logic circuit configured to generate said third control signal in response to (i) said one or more second control signals and (ii) said clock signal.

3. The apparatus according to claim 1, wherein said first circuit is further configured to generate an output signal having a second data rate.

4. The apparatus according to claim 1, wherein said first circuit comprises a digital linear phase detector and said second circuit comprises a digital frequency detector.

5. The apparatus according to claim 3, wherein said output signal comprises a re-timed data signal and said clock signal comprises a recovered clock signal.

6. The apparatus according to claim 2, wherein said second logic circuit comprises a gate and a counter, wherein said counter is configured to generate said third control signal.

7. The apparatus according to claim 6, wherein said counter is configured to (i) calculate a count signal and (ii) reset said count signal in response to said gate and said logic signal.

8. The apparatus according to claim 7, wherein said gate is configured to control said counter in response to said one or more second control signals.

9. The apparatus according to claim 8, wherein said first logic circuit is further configured to select either (i) said one or more first control signals or (ii) said one or more second control signals.

10. The apparatus according to claim 1, further comprising a third logic circuit configured to control said second logic circuit in response to (i) said first logic circuit, (ii) said control signal and (iii) said logic signal.

11. The apparatus according to claim 10, wherein said apparatus comprises a reference-less single active loop clock and data recovery PLL architecture.

12. The apparatus according to claim 1, wherein said first logic circuit comprises:
- a multiplexer configured to receive said first and second control signals and present one or more selected control signals in response to said third control signal;
- a charge pump filter configured to present a filter control signal in response to said selected control signals; and
- a voltage controlled oscillator configured to generate said clock signal in response to said filter control signal.

13. An apparatus comprising:
- means for generating one or more first control signals having a first data rate in response to (i) an input signal having a second data rate and (ii) a clock signal having said first data rate;
- means for generating one or more second control signals having said first data rate in response to (i) said input signal and (ii) said clock signal; and
- means for generating said clock signal in response to (i) said one or more first control signals, (ii) said one or more second control signals and (iii) a third control signal, wherein one of said first control signals and said second control signals comprises a pump-up signal and another one of said first control signals and said second control signals comprises a pump-down signal.

14. A method for reference-free clock generation and data recovery, comprising the steps of:
- (A) generating one or more first control signals having a first data rate in response to (i) an input signal having a second data rate and (ii) a clock signal having said first data rate;
- (B) generating one or more second control signals having said first data rate in response to (i) said input signal and (ii) said clock signal; and
- (C) generating said clock signal in response to (i) said one or more first control signals, (ii) said one or more second control signals and (iii) a third control signal, wherein one of said first control signals and said second control signals comprises a pump-up signal and another one of said first control signals and said second control signals comprises a pump-down signal.

15. The method according to claim 14, further comprising the step of:
- (D) generating said third control signal in response to said one or more second signals and said logic signal.

16. The method according to claim 14, wherein said output signal comprises a re-timed data signal and said clock signal comprises a recovered clock signal.

17. The method according to claim 15, wherein step (D) further comprises (i) calculating a count and (ii) resetting said count in response to said gate and said logic signal.

18. The method according to claim 14, wherein step (C) further comprises selecting either said one or more first control signals or said one or more second control signals.

19. The method according to claim 15, further comprising the step of:
- (E) controlling said step (D) in response to (i) said third control signal and (ii) said clock signal.

* * * * *